US006768954B2

(12) United States Patent
Niijima

(10) Patent No.: US 6,768,954 B2
(45) Date of Patent: Jul. 27, 2004

(54) JITTER QUANTITY CALCULATOR AND TESTER

(75) Inventor: Hirokatsu Niijima, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/457,226

(22) Filed: Jun. 9, 2003

(65) Prior Publication Data

US 2003/0210032 A1 Nov. 13, 2003

Related U.S. Application Data

(63) Continuation of application No. PCT/JP01/10803, filed on Dec. 11, 2001.

(30) Foreign Application Priority Data

Dec. 11, 2000 (JP) .......................................... 2000-375874

(51) Int. Cl.$^7$ ............................................... G01R 29/26
(52) U.S. Cl. ......................................... 702/69; 375/226
(58) Field of Search ...................... 702/68, 69, 70–72, 702/75, 79, 117, 118, 121–126, 177, 189; 375/226, 371, 376; 327/156–163

(56) References Cited

U.S. PATENT DOCUMENTS

| | | | | | |
|---|---|---|---|---|---|
| 4,777,640 | A | * | 10/1988 | Turner et al. ................ | 375/371 |
| 4,855,683 | A | * | 8/1989 | Troudet et al. ............. | 327/159 |
| 5,515,108 | A | * | 5/1996 | Kim ............................ | 348/498 |
| 5,719,907 | A | * | 2/1998 | Kaku et al. .................. | 375/371 |
| 5,761,241 | A | * | 6/1998 | Martin ........................ | 375/226 |
| 5,903,605 | A | * | 5/1999 | Crittenden .................. | 375/226 |
| 5,982,835 | A | * | 11/1999 | Kim et al. ................... | 375/376 |
| 6,064,706 | A | * | 5/2000 | Driskill et al. .............. | 375/372 |
| 6,185,510 | B1 | * | 2/2001 | Inoue .......................... | 702/69 |
| 6,275,553 | B1 | * | 8/2001 | Esaki .......................... | 375/371 |

FOREIGN PATENT DOCUMENTS

| JP | 53-15175 | 2/1978 |
|---|---|---|
| JP | 53-102784 | 9/1978 |
| JP | 54-37619 | 3/1979 |
| JP | 62-133360 | 6/1987 |
| JP | 10-288653 | 10/1998 |
| JP | 2000-188617 | 7/2000 |
| JP | 2000-314767 | 11/2000 |

OTHER PUBLICATIONS

Patent Abstracts of Japan, Publication No. 10–288653, Oct. 27, 1998, 1 pg.
Patent Abstracts of Japan, Publication No. 2000–188617, Jul. 4, 2000, 1 pg.
Patent Abstracts of Japan, Publication No. 2000–314767, Nov. 14, 2000, 1 pg.
Patent Abstracts of Japan, Publication No. 54–037619, Mar. 20, 1979, 1 pg.
Patent Abstracts of Japan, Publication No. 53–102784, Sep. 7, 1978, 1 pg.
Patent Abstracts of Japan, Publication No. 53–015175, Feb. 10, 1978, 1 pg.
PCT International Preliminary Examination Report Issued in International Application No. PCT/JP01/10803 dated Dec. 13, 2002, with translation (6 pgs.).
PCT International Search Report issued in International Application No. PCT/JP01/10803 mailed Jan. 15, 2002 with translation (4 pgs.).

* cited by examiner

Primary Examiner—Marc S. Hoff
Assistant Examiner—Mohamed Charioui
(74) Attorney, Agent, or Firm—Osha & May L.L.P.

(57) ABSTRACT

A jitter quantity calculator comprising a timing generator, a section for calculating the value of an output signal based on a timing generated by the timing generator, first and second decision sections for deciding, respectively, whether the value of an output signal from the calculating section is equal to or greater than first and second reference values, and a section for calculating the quantity of jitter of the output signal based on the decision results from the first and second decision sections, wherein the section for calculating the quantity of jitter comprises a plurality of means for calculating the quantity of jitter, and a section for selecting any one of the plurality of means and for calculating the quantity of jitter of the output signal.

16 Claims, 5 Drawing Sheets

JITTER QUANTITY CALCULATOR AND TESTER

The present application is a continuation application of PCT/JP01/10803 filed on Dec. 11, 2001, claiming priority from a Japanese patent application No. 2000-375874 filed on Dec. 11, 2000, the contents of which are incorporated herein by reference.

BACKGROUND OF THE INVENTION

1. Field of the Invention

The present invention relates to a tester for testing acceptability of an electronic device. More particularly, the present invention relates to a tester for testing the acceptability of the electronic device based on quantity of jitter of an output signal output from the electronic device.

2. Description of Related Art

Conventionally, in order to calculate quantity of jitter of an output signal output from an electronic device, the output signal output from the electronic device is measured multiple times by an oscilloscope or the like and the quantity of jitter is calculated from wave form of the measured output signal. For example, timing of the output signal consisting with a predetermined reference value is measured, and the quantity of jitter of rising and falling of the output signal are calculated by variation of the timing.

In recent years, jitter of an output signal output from a semiconductor element of an electronic equipment has been a problem with complication of the electronic equipment. For this reason, improvement in the analysis of the quantity of jitter for each path of the semiconductor device and calculation accuracy of the quantity of jitter etc. is desired. However, it has been difficult to calculate the quantity of jitter with sufficient accuracy by the conventional calculation methods of the quantity of jitter due to an error in function of the oscilloscope or the like. Moreover, since it is necessary to operate the oscilloscope etc. manually, it takes a lot of time to calculate the quantity of jitter.

SUMMARY OF THE INVENTION

In order to solve the aforesaid problem, according to the first aspect of the present invention, there is provided a jitter quantity calculator for calculating quantity of jitter of an output signal output from an electronic device. The jitter quantity calculator includes: a timing generator for generating timing; a value calculating section for calculating a value of the output signal multiple times based on the timing generated by the timing generator; a first decision section for deciding whether the value of the output signal, which is calculated by the value calculating section multiple times, is greater than or equal to a first reference value, and for outputting the decision result; a second decision section for deciding whether the value of the output signal, which is calculated by the value calculating section multiple times, is greater than or equal to a second reference value, and for outputting the decision result; and a jitter calculating section including first calculation means for calculating the quantity of jitter of the output signal based on the number of times the value of the decision result of the output signal is less than the first reference value in the first decision section and the value of the output signal is greater than or equal to the second reference value in the second decision section. The timing generator generates different timing whenever the value calculating section calculates the value of the output signal a predetermined number of times, and the first calculation means calculates the quantity of jitter of the output signal based on the number of the decision for each of the different timings.

According to the first aspect of the present invention, the jitter calculation section may further include second calculation means for calculating the quantity of jitter of the output signal based on the number of times the value of the decision result of the output signal is greater than or equal to the first reference value in the first decision section. The second calculation means may calculate the quantity of jitter of the output signal based on the number of the decision for each of the different timings. The jitter calculation section may further include third calculation means for calculating the quantity of jitter of the output signal based on the number of times the value of the decision result of the output signal is less than the second reference value in the second decision section. The third calculation means may calculate the quantity of jitter of the output signal based on the number of the decision for each of the different timings. The jitter calculation section may further include third calculation means for calculating the quantity of jitter of the output signal based on the number of times the value of the decision result of the output signal is less than the second reference value in the second decision section. The third calculation means may calculate the quantity of jitter of the output signal based on the number of the decision for each of the different timings, and the jitter quantity calculator may further include a calculation means selection section for selecting either the first calculation means, the second calculation means or the third calculation means to causes it to calculate the quantity of jitter of the output signal.

Moreover, the timing generator may generate two timings in a predetermined interval, the first decision section may decide whether the value of the output signal, which is calculated multiple times by the value calculating section based on one of the two timings, is greater than or equal to the first reference value, and outputs the decision result, the second decision section may decide whether the value of the output signal, which is calculated multiple times by the value calculating section based on the other timing of the two timings, is greater than the second reference value, and outputs the decision result, and the timing generator may generate two different timings whenever the value calculating section calculates the value of the output signal a predetermined times.

The jitter calculation section may further include fourth calculation means for calculating the quantity of jitter of the output signal based on the number of times the value of the decision result of the output signal is greater than or equal to the first reference value in the first decision section and the value of the output signal is less than the second reference value in the second decision section. The fourth calculation means may calculate the quantity of jitter of the output signal based on the number of the decision for each of the two different timings. The jitter calculation section may further include fifth calculation means for calculating the quantity of jitter of the output signal based on the number of times the value of the decision result of the output signal is greater than or equal to the first reference value in the first decision section and the value of the output signal is greater than or equal to the second reference value in the second decision section. The fifth calculation means may calculate the quantity of jitter of the output signal based on the number of the decision for each of the two different timings. The jitter calculation section may further include sixth calculation means for calculating the quantity of jitter of the output signal based on the number of times the value of the decision result of the output signal is less than the first reference value in the first decision section and the value of the output signal is less than the second reference value in the second decision section. The sixth calculation means may calculate the quantity of jitter of the output signal based on the number of the decision for each of the two different timings.

Moreover, the jitter calculation section may further include: fifth calculation means for calculating the quantity of jitter of the output signal based on the number of times the value of the decision result of the output signal is greater than or equal to the first reference value in the first decision section and the value of the output signal is greater than or equal to the second reference value in the second decision section; and sixth calculation means for calculating the quantity of jitter of the output signal based on the number of times the value of the decision result of the output signal is less than the first reference value in the first decision section and the value of the output signal is less than the second reference value in the second decision section. The fifth calculation means and the sixth calculation means may calculate the quantity of jitter of the output signal based on the number of the decision for each of the two different timings, and the jitter quantity calculator may further include a calculation means selection section for selecting either the first calculation means, the fourth calculation means, the fifth calculation means or the sixth calculation means, and for causing it to calculate the quantity of jitter of the output signal. The jitter calculation section may further include a storage section for storing the number of the decision for each of the different timings which are generated by the timing generator whenever the value calculating section calculates the value of the output signal a predetermined number of times.

Moreover, the calculation means selection section may supply selection information to the jitter calculating section, the selection information indicating a either of the calculation means which is to be selected among the first calculation means, the fourth calculation means, the fifth calculation means or the sixth calculation means. The jitter calculating section may receive the selection information and the decision result of the first decision section and the second decision section. The jitter calculating section may decide whether each of the decision result satisfies criteria of the selected calculation means. The jitter calculating section may count the number of times the decision result satisfies the criteria, as the number of the decision.

Moreover, the calculation means selection section may supply a switching signal INV1 and a switching signal INV2, which indicate the criteria of the calculation means which is to be selected, to the quantity-of-jitter calculating section as the selection information. The jitter calculating section may include: a first criteria comparison section for receiving the switching signal INV1 and a decision result of the first decision section, and for deciding whether the decision result of the first decision section satisfies the criteria of the selected calculation means; a second criteria comparison section for receiving the switching signal INV2 and the decision result of the second decision section, and for deciding whether the decision result of the second decision section satisfies the criteria of the selected calculation means; a third criteria comparison section for deciding whether the decision result of both the first decision section and the second decision section satisfies the criteria of the selected calculation means based on the decision result of the first criteria comparison section and the second criteria comparison section; and a counter for counting the number of times both of the criteria of the selected calculation means are satisfied in the third criteria comparison section as the number of the decision.

Moreover, the first criteria comparison section may be a first exclusive-OR circuit outputting exclusive OR of the decision result of the first decision section and the switching signal INV1, the second criteria comparison section may be a second exclusive-OR circuit outputting exclusive OR of the decision result of the second decision section and the switching signal INV2, the third criteria comparison section may be an AND circuit outputting AND of negation of the output of the first exclusive-OR circuit, and negation of the output of the second exclusive-OR circuit.

Moreover, the first decision section may include a first switching section for switching whether to supply the decision result of the first decision section to the jitter calculating section, the second decision section may include a second switching section for switching whether to supply the decision result of the second decision section to the jitter calculating section, and the calculation means selection section may supply a control signal CPE for controlling the first switching section and the second switching section to the first switching section and the second switching section. Moreover, the jitter calculating section may further include a third switching section for switching whether to supply the decision result of the third criteria comparison section to the counter based on the control signal CPE.

According to the second aspect of the present invention, there is provided a tester for deciding acceptability of an electronic device. The tester includes: a signal generator for generating a test signal for test and for inputting it into the electronic device; a jitter quantity calculator for calculating quantity of jitter of an output signal output from the electronic device based on the input test signal; and an acceptability decision section for deciding the acceptability of the electronic device based on the quantity of jitter calculated by the jitter quantity calculator. The jitter quantity calculator includes: a timing generator for generating timing; a value calculating section for calculating a value of the output signal multiple times based on the timing generated by the timing generator; a first decision section for deciding whether the value of the output signal, which is calculated by the value calculating section multiple times, is greater than or equal to a first reference value, and for outputting the decision result; a second decision section for deciding whether the value of the output signal, which is calculated by the value calculating section multiple times, is greater than or equal to a second reference value, and for outputting the decision result; and a jitter calculating section including first calculation means for calculating the quantity of jitter of the output signal based on the number of times the value of the decision result of the output signal is not greater than or equal to the first reference value in the first decision section and the value of the output signal is greater than or equal to the second reference value in the second decision section. The timing generator generates different timing whenever the value calculating section calculates the value of the output signal a predetermined number of times, and the first calculation means calculates the quantity of jitter of the output signal based on the number of the decision for each of the different timings.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
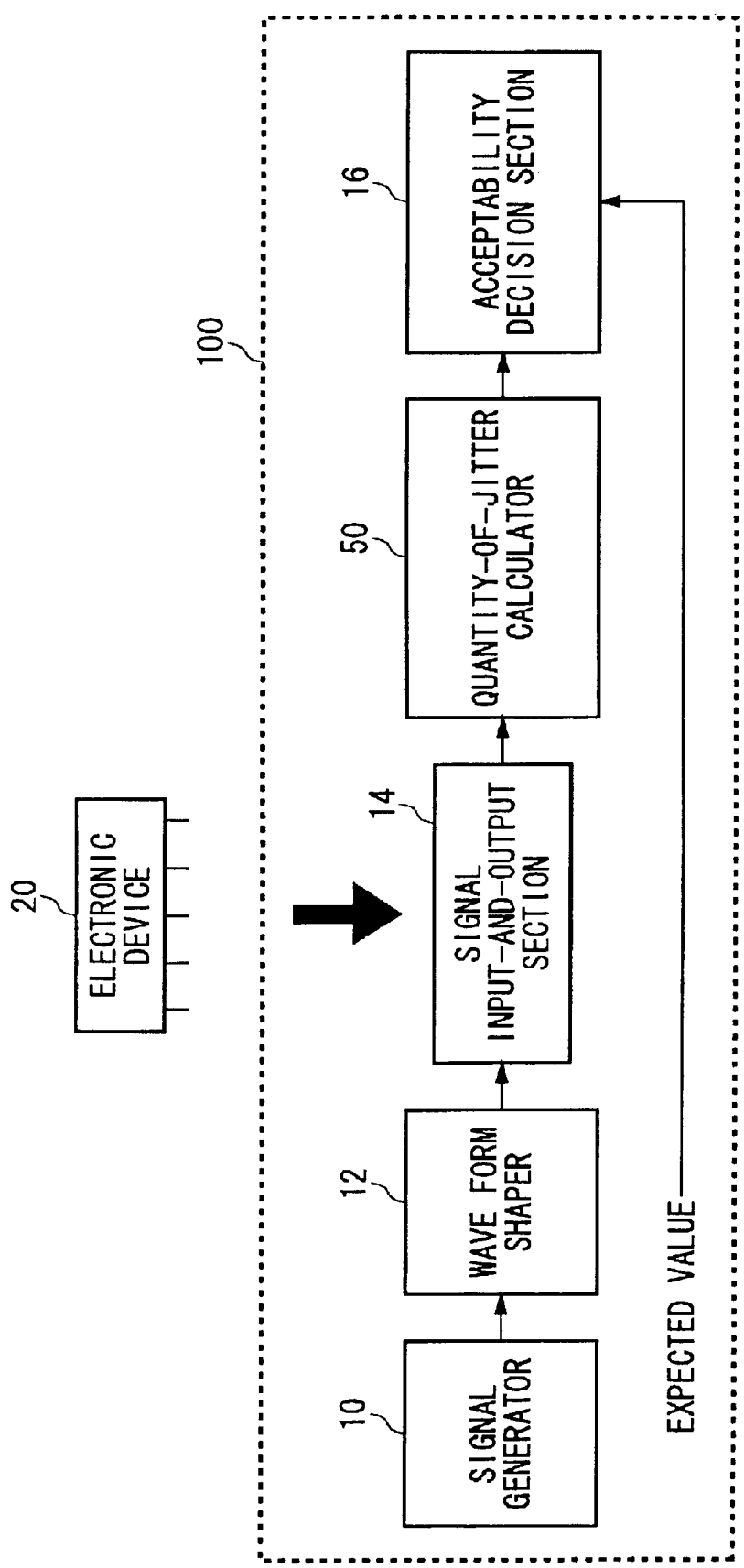
FIG. 1 is a block diagram exemplary showing a configuration of a tester 100 according to the present invention.

FIG. 1 is a block diagram exemplary showing a configuration of a tester 100 according to the present invention. The tester 100 includes: a signal generator 10 for generating a test signal; a wave form shaper 12 for shaping the test signal; a signal input-and-output section 14 for transmitting and receiving a signal to/from an electronic device 20; a jitter quantity calculator 50 for calculating quantity of jitter of an output signal output from the electronic device 20; and an acceptability decision section 16 for deciding acceptability of the electronic device 20.

The signal generator 10 generates a test signal for the testing of the electronic device 20, and inputs it into the electronic device 20 through the wave form shaper 12 and the signal input-and-output section 14. The wave form shaper 12 shapes the test signal generated by the signal generator 10. For example, the test signal generated by the signal generator 10 is delayed for a predetermined period by the wave form shaper 12, and the test signal is input into the signal input-and-output section 14. The signal input-and-output section 14 connects with the electronic device 20 electrically, and the signal input-and-output section 14 inputs the test signal received from the wave form shaper 12 into the electronic device 20. Moreover, the signal input-and-output section 14 receives the output signal output from the electronic device 20 based on the test signal, and outputs it to the jitter quantity calculator 50.

The jitter quantity calculator 50 calculates the quantity of jitter of the output signal output from the electronic device 20 based on the input test signal. The acceptability decision section 16 decides the acceptability of the electronic device 20 based on the quantity of jitter calculated by the jitter quantity calculator 50. For example, an expected value is supplied to the acceptability decision section 16, and if the calculated quantity of jitter is greater than or equal to the expected value, it decides that the tested electronic device 20 is defective. Alternatively, a plurality of different expected values are supplied to the acceptability decision section 16, and the plurality of different expected values are compared with the calculated quantity of jitter. Then, the acceptability decision section 16 decides the acceptability of an electronic device 20 for each of the expected values and decides the quality of the electronic device 20. That is, the acceptability decision section 16 decides a quality grade of the electronic device 20 based on the calculated quantity of jitter.

Figure 2:
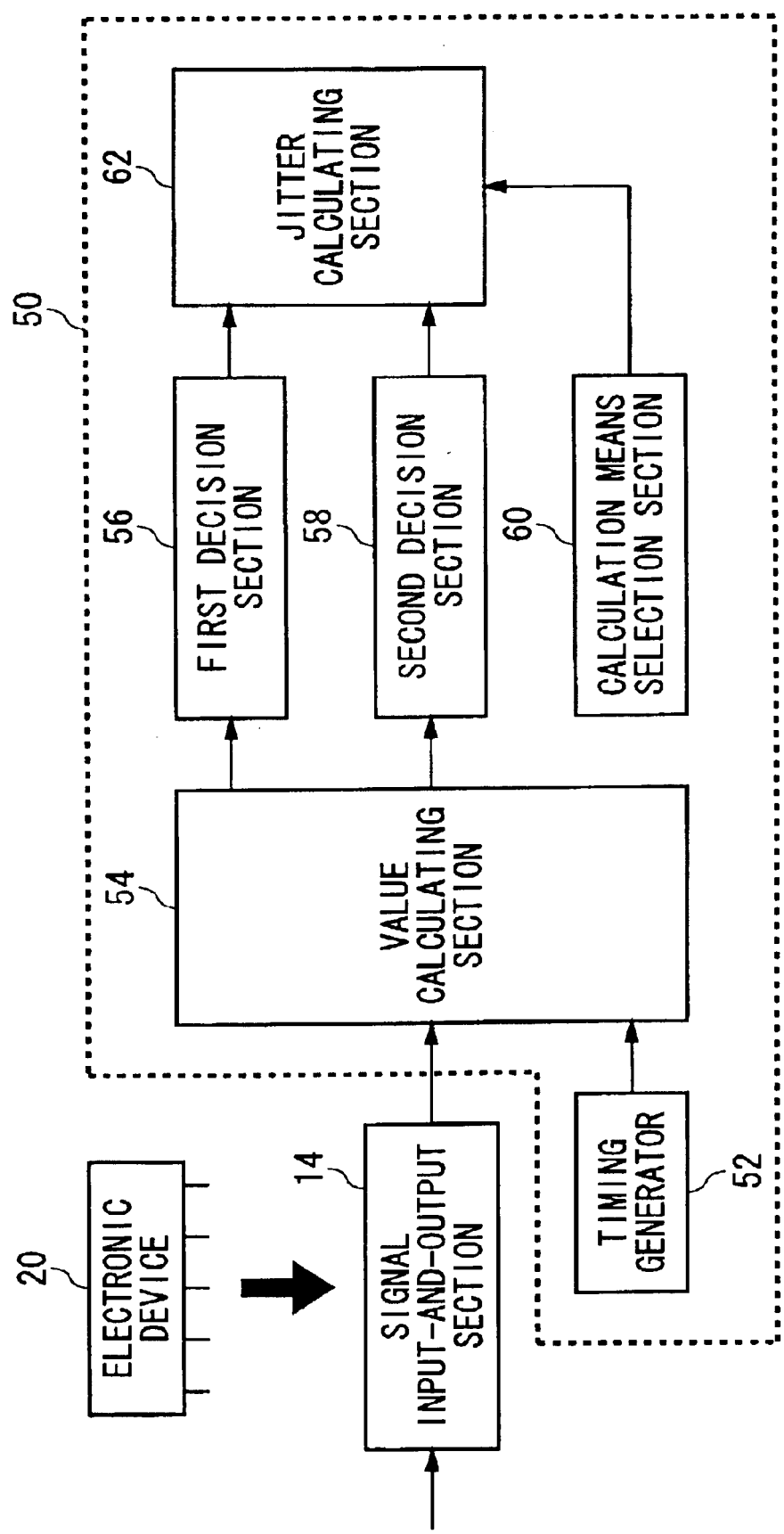
FIG. 2 is a block diagram exemplary showing a configuration of a jitter calculator 50 according to the present invention.

FIG. 2 is a block diagram exemplary showing a configuration of the jitter calculator 50 according to the present invention.

The jitter calculator 50 includes: a timing generator 52 for generating timing; a value calculating section 54 for calculating a value of the output signal output from the electronic device 20 based on the timing; a first decision section 56 and a second decision section for deciding whether the value calculated by the value calculating section 54 is greater than or equal to a reference value; a jitter calculating section 62 for calculating the quantity of jitter of the output signal based on the decision result of the first decision section and the second decision section; and the calculation means selection section 60 for selecting calculation means in the jitter calculating section 62.

For example, the timing generator 52 includes: a pulse generation section for generating a timing pulse; and a variable delay circuit for delaying and outputting the timing pulse. The value calculating section 54 calculates the value of the output signal multiple times based on the timing generated by the timing generator 52. The first decision section 56 decides whether each of the values of the output signal calculated by the value calculating section 54 multiple times are greater than or equal to a first reference value, and outputs the result of the decision. The second decision section 58 decides whether each of the values of the output signal calculated by the value calculating section 54 multiple times are greater than or equal to a second reference value, and outputs the result of the decision. It is preferable that the timing generator 52 generates different timing whenever the value calculating section 54 calculates the value of the output signal a predetermined number of times.

The jitter calculating section 62 calculates the quantity of jitter based on the decision result output from the first decision section 56 and the second decision section 58. That is, the jitter calculating section 62 calculates the quantity of jitter based on the number of times the decision results, which are output from the first decision section 56 and the second decision section 58 at each of the timings generated by the timing generator 52, become predetermined results. It is preferable that the jitter calculating section 62 includes a plurality of calculation means for calculating the quantity of jitter, and calculates the quantity of jitter. Furthermore, the calculation means selection section 60 selects either of the plurality of calculation means of the jitter calculating section 62, and causes it to calculate the quantity of jitter of the output signal.

Figure 3A:
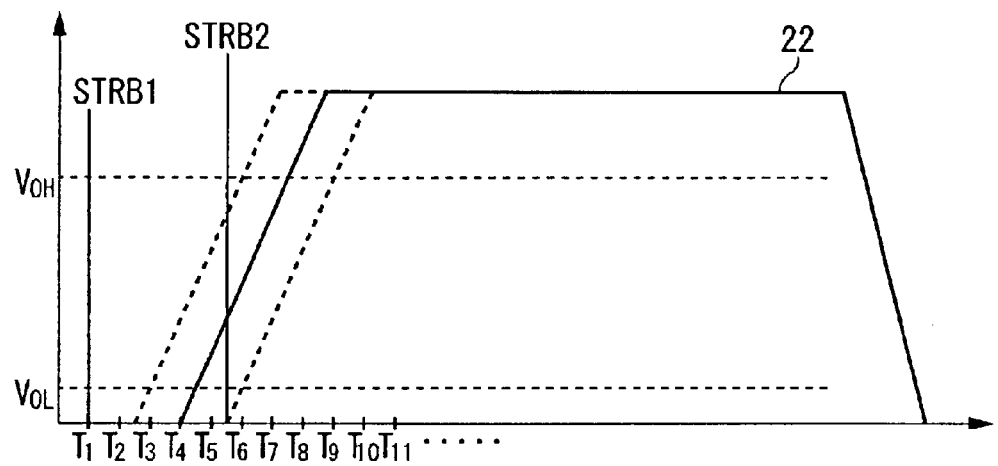
FIG. 3A and FIG. 3B are explanatory diagrams of means for calculating quantity of jitter of an output signal of an electronic device 20, in a jitter calculating section 62.
Figure 3B:
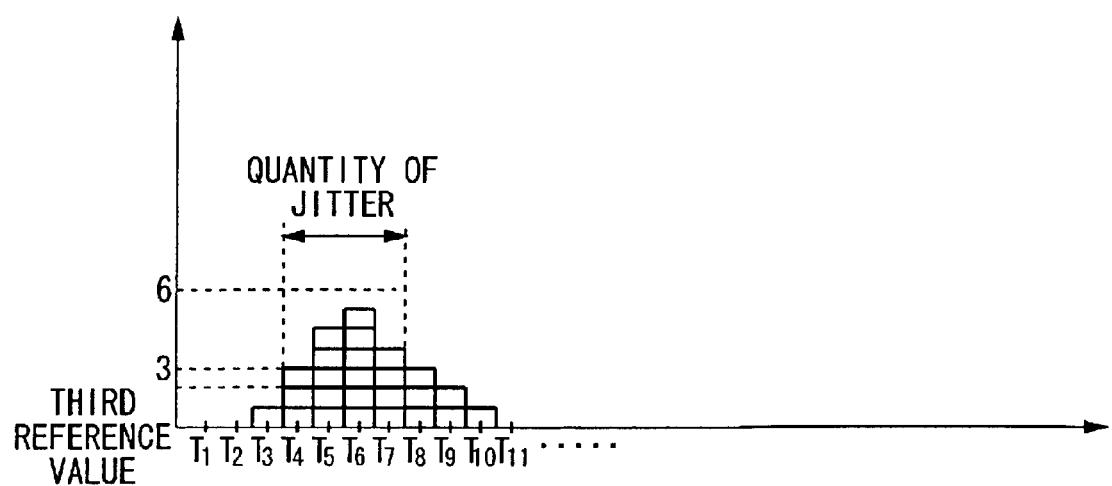

FIG. 3A and FIG. 3B are explanatory diagrams of means for calculating quantity of jitter of the output signal of the electronic device 20, in the jitter calculating section 62. FIG. 3A is a wave form chart showing the output signal 22 output from the electronic device 20 and the timing generated by the timing generator 52. In FIG. 3A, a horizontal axis shows time and a vertical axis shows signal level.

First, in the jitter calculating section 62, a first calculation means for calculating the quantity of jitter of the output signal of the electronic device 20 will be explained. First, the timing generator 52 generates a predetermined timing (STRB1) for detecting a value of the output signal 22. In this example, the timing generator 52 generates the STRB1 at the timing shown as $T_1$. The value calculating section 54 acquires the value of the output signal 22 multiple times at the timing of STRB1. The first decision section 56 decides whether each of the values, which is acquired by the value calculating section 54 multiple times, is greater than or equal to the first reference value, and outputs the result of the decision for each of the values. The second decision section 58 decides whether each of the values, which is acquired by the value calculating section 54 multiple times, is greater than or equal to the second reference value, and outputs the result of the decision for each of the values. In this example, VOH, which is 80% of voltage of H logic level of the output signal 22, is supplied as the first reference value, and VOL, which is 20% of voltage of H logic level of the output signal 22, is supplied as the second reference value. The signal, which is output from the value calculating section 54 by calculating the value of the output signal 22, is a digital signal, of which the value is 1 when the logic level of the output signal 22 is H, or 0 when the logic level of the output signal 22 is L.

Next, the jitter calculating section 62 counts the number of the decision result how many times each of the values of the output signal 22 does not become greater than or equal to the first reference value in the first decision section 56, and how many times each of the values of the output signal 22 becomes greater than or equal to the second reference value in the second decision section 58. In case that the output signal 22 includes jitter, even if it is a case where the value calculating section 54 acquires the values of the output signal 22 multiple times at the same timing, the values acquired by the value calculating section 54 are different from one another. Therefore, the output results of the first decision section 56 and the second decision section 58 are different from one another depending on each of the values of the output signal 22 acquired by the value calculating section 54 multiple times. The jitter calculating section 62 includes: a counter for counting the number of times each of the values of the decision result of the output signal 22 does not become greater than or equal to the first reference value in the first decision section and how many times each of the values of the output signal 22 becomes greater than or equal to the second reference value in the second decision section 58; and means for calculating the quantity of jitter of the output signal 22 based on the number counted by the counter.

When the value calculating section 54 calculates the value of the output signal 22 a predetermined number of times at the timing of $T_1$, the timing generator 52 generates the timing of $T_2$ as STRB1. At the timing of $T_2$ similarly, the jitter calculating section 62 counts the number of the decision result how many times each of the values of the output signal does not become greater than or equal to the first reference value in the first decision section and how many times each of the values of the output signal becomes greater than or equal to the second reference value in the second decision section 58. In a similar manner, the timing generator 52 generates different timings whenever the value calculating section 54 calculates the value of the output signal 22 a predetermined number of times. In this example, as shown in FIG. 3A, the timing generator 52 generates a plurality of different timings $T_1, T_2, T_3, \ldots, T_{11}$, and the jitter calculating section 62 counts the decision result of the first decision section 56 and the second decision section 58 satisfying criteria of the first calculation means at each of the timings.

FIG. 3B shows an example of a distribution of the number of the decision result satisfying the criteria about the output signal 22 shown in FIG. 3A. A horizontal axis shows the timing generated by the timing generator 52, and a vertical axis shows the number of the decision result satisfying the criteria of the first calculation means. The timing generator 52 generates different timing whenever the value calculating section 54 calculates a predetermined number of the values of the output signal. In FIG. 3A, when the output signal 22 includes jitter in a range shown by dotted lines, it has a distribution as shown in FIG. 3B.

Based on the number of the decision result for each of the timings generated by the timing generator 52, the jitter calculating section 62 calculates the quantity of jitter of the output signal 22, and calculates the quantity of jitter in an electric path of the electronic device 20 through which the output signal has passed. The jitter calculating section 62 calculates the quantity of jitter based on the timing in which the number of the decision result satisfying the criteria for each of the timings generated by the timing generator 52 becomes greater than or equal to a predetermined third reference value. The third reference value is an arbitrary integer.

Next, second calculation means will be explained hereinafter. In the second calculation means, the jitter calculating section 62, the value calculating section 54, and the timing generator 52 have the same or similar operations and functions as/to that of the first calculation means. The second calculation means calculates the quantity of jitter of the output signal 22 based on the number of times the value of the decision result of the output signal 22 is greater than or equal to the first reference value in the first decision section 56. Also in the second calculation means, the quantity of jitter of the output signal 22 is calculated in a similar manner to the first calculation means based on the distribution of the number of the decision satisfying the criteria of the second calculation means in the first decision section 56 for each of the different timings generated by the timing generator 52.

Next, a third calculation means will be explained hereinafter. In the third calculation means, the jitter calculating section 62, the value calculating section 54, and the timing generator 52 have the same or similar operations and a functions as/to that of the first calculation means or the second calculation means. The third calculation means calculates the quantity of jitter of the output signal 22 based on the number of times the value of the decision result of the output signal 22 is less than the second reference value in the second decision section 58. Also in the third calculation means, the quantity of jitter of the output signal 22 is calculated based on the distribution of the number of the decision satisfying the criteria of the third calculation means in the second decision section 58 for each of the different timings generated by the timing generator 52 generates in a similar manner to the first calculation means or the second calculation means.

The calculation means selection section 60 selects either the first calculation means, the second calculation means or the third calculation means, which have been explained hereinbefore, and causes it to calculate the quantity of jitter of the output signal 22. According to the jitter quantity calculator 50 explained hereinbefore, since it includes the plurality of quantity-of-jitter calculation means and the plurality of quantity-of-jitter calculation means are selected to calculate the quantity of jitter of the output signal 22, the output signal 22 and the electronic device 20 are analyzed in detail. Moreover, since the operation of the oscilloscope or the like is not necessary, the quantity of jitter of the output signal 22 is calculated accurately and rapidly.

While the timing generator 52 explained in this example generates one timing whenever the value calculating section 54 calculates the value of the output signal 22 a predetermined times, the timing generator 52 generates two timings whenever the value calculating section 54 calculates the value of the output signal 22 a predetermined times in another example. Hereinafter, the example in which the timing generator 52 generates two timings will be explained.

The timing generator 52 generates two timings in a predetermined interval. The first decision section 56 decides whether the value of the output signal 22, which is calculated multiple times by the value calculating section 54 based on one of the two timings, is greater than or equal to the first reference value, and the decision result is output. The second decision section 58 decides whether the value of the output signal 22, which is calculated multiple times by the value calculating section 54 based on the other timing of the two timings, is less than or equal to the second reference value, and the decision result is output. The timing generator 52 generates two different timings whenever the value calculating section 54 calculates the value of the output signal 22 a predetermined times.

As shown in FIG. 3A, the timing generator 52 generates timing $T_1$ (STRB1) and timing (STRB2), which is delayed for a predetermined period from the STRB1, at first. The first decision section 56 decides whether the value of the output signal 22, which is calculated by the value calculating section 54 at the timing STRB1, is greater than or equal to the first reference value, and the second decision section 58 decides whether the value of the output signal, which is calculated by the value calculating section 54 at the timing STRB2, is greater than or equal to the second reference value. The jitter calculating section 62 has similar operation and function to the above-explained jitter calculating section 62 with the timing generator 52 generating one timing. The jitter calculating section 62 calculates the quantity of jitter of the output signal 22 based on the number of the decision result of the first decision section 56 and the second decision section 58 satisfying the criteria of the calculation means for calculating the quantity of jitter.

The first calculation means in this example will be explained hereinafter.

After the value calculating section 54 calculates the value of the output signal 22 at the timings STRB1 (T1) and STRB2 a predetermined times, the timing generator 52 generates a timing T2 as STRB1, and generates a timing, which is delayed for a predetermined period from T2, as STRB2. At the STRB1 and the STRB2 similarly, the jitter calculating section 62 counts the number of the decision result how many times each of the values of the output signal 22 becomes greater than or equal to the first reference value in the first decision section 58 and how many times each of the values of the output signal 22 does not become greater than or equal to the second reference value in the second decision section 58. In the first decision section, the jitter calculating section 62 includes a counter for counting the number of the decision result how many times each of the values of the output signal 22 becomes greater than or equal to the first reference value in the first decision section and how many times each of the values of the output signal 22 does not become greater than or equal to the second reference value in the second decision section 58. In a similar manner, the timing generator 52 generates two different timings whenever the value calculating section 54 calculates the value of the output signal 22 a predetermined number of times. In this example, as shown in FIG. 3A, the timing generator 52 generates a plurality of different timings T1, T2, T3, . . . , T11 as the STRB1, and the timings, which are delayed for a predetermined period from the STRB1 respectively, as the STRB2. Next, the jitter calculating section 62 counts the decision result of the first decision section 56 and the second decision section 58 satisfying criteria of the first calculation means at each of the two timings.

The jitter calculating section 62 calculates the quantity of jitter of the output signal 22 based on the number of the decision result for the two different timings generated by the timing generator 52. The jitter calculating section 62 calculates the quantity of jitter of the output signal 22 by the same or similar method as/to the calculation method explained in relation to FIG. 3B.

Next, fourth calculation means for calculating the quantity of jitter in this example will be explained. In the fourth calculation means, the jitter calculating section 62, the value calculating section 54, and the timing generator 52 have the same or similar operations and functions as/to the first calculation means. The fourth calculation means calculates the quantity of jitter of the output signal 22 based on the number of times the value of the decision result of the output signal 22 is greater than or equal to the first reference value in the first decision section 56 and the value of the output signal 22 is less than the second reference value in the second decision section 58. Also in the fourth calculation means, the jitter calculating section 62 calculates the quantity of jitter of the output signal 22 in a similar manner to the first calculation means based on the distribution of the number of the decision satisfying the criteria of the fourth calculation means in the first decision section 56 and the second decision section 58 for two different timings generated by the timing generator 52.

Next, fifth calculation means for calculating the quantity of jitter in this example will be explained. In the fifth calculation means, the jitter calculating section 62, the value calculating section 54, and the timing generator 52 have the same or similar operations and functions as/to the first calculation means or the fourth calculation means. The fifth calculation means calculates the quantity of jitter of the output signal 22 based on the number of times the value of the decision result of the output signal 22 is greater than or equal to the first reference value in the first decision section 56 and the value of the output signal 22 is greater than or equal to the second reference value in the second decision section 58. Also in the fifth calculation means, the jitter calculating section 62 calculates the quantity of jitter of the output signal 22 in a similar manner to the first calculation means or the fourth calculation means based on the distribution of the number of the decision satisfying the criteria of the fifth calculation means in the first decision section 56 and the second decision section 58 for two different timings generated by the timing generator 52.

Next, sixth calculation means for calculating the quantity of jitter in this example will be explained. In the sixth calculation means, the jitter calculating section 62, the value calculating section 54, and the timing generation 52 have the same or similar operations and functions as/to the first calculation means, the fourth calculation means or the fifth calculation means. The sixth calculation means calculates the quantity of jitter of the output signal 22 based on the number of times the value of the decision result of the output signal 22 is less than the first reference value in the first decision section 56 and the value of the output signal 22 is less than the second reference value in the second decision section 58. Also in the sixth calculation means, the jitter calculating section 62 calculates the quantity of jitter of the output signal 22 in a similar manner to the first calculation means, the fourth calculation means or the fifth calculation means based on the distribution of the number of the decision satisfying the criteria of the sixth calculation means in the first decision section 56 and the second decision section 58 for two different timings generated by the timing generator 52.

The calculation means selection section 60 selects either the first calculation means, the fourth calculation means, the fifth calculation means or the sixth calculation means, which have been explained hereinbefore, and causes it to calculate the quantity of jitter of the output signal 22. Alternatively, the calculation means selection section 60 selects either the first calculation means, the second calculation means, the third calculation means, the fourth calculation means, the fifth calculation means or the sixth calculation means, which have been explained hereinbefore, and causes it to calculate the quantity of jitter of the output signal 22. For example, based on the timing of STRB1 generated by the timing generator 52, the first calculation means detects rising and falling of the output signal 22, the timing generator 52 generates two timings (STRB1, STRB2) based on timings based on the detected rising and falling, the first to the sixth calculation means calculate the quantity of jitter of the output signal 22, and then the output signal 22 is analyzed in detail. Alternatively, the jitter calculating section 62 includes a plurality of calculation means among the first to sixth calculation means explained hereinbefore, and the calculation means selection section 60 selects either of the calculation means of the jitter calculating section 62 to calculate the quantity of jitter.

According to the jitter quantity calculator 50 explained hereinbefore, since it includes the plurality of quantity-of-jitter calculation means and the plurality of quantity-of-jitter calculation means are selected to calculate the quantity of jitter, the output signal 22 is analyzed in detail. Moreover, since the operation of the oscilloscope or the like is not necessary, the quantity of jitter of the output signal 22 is calculated accurately and rapidly.

Moreover, while the first decision section 56 decides whether the value of the output signal 22 at the timing STRB1 is greater than or equal to the first reference value and the second decision section 58 decides whether the value of the output signal 22 at the timing STRB2, which is delayed for a predetermined period from the STRB1, is less than or equal to the second reference value in this example, the second decision section 58 decides whether the value of the output signal 22 calculated by the value calculating section 54 at the timing STRB1 is greater than or equal to the second reference value and the first decision section 56 decides whether the value of the output signal 22 calculated by the value calculating section 54 at the timing STRB2, which is delayed for a predetermined period from the timing STRB1, is less than or equal to the first reference value in another example.

Figure 4:
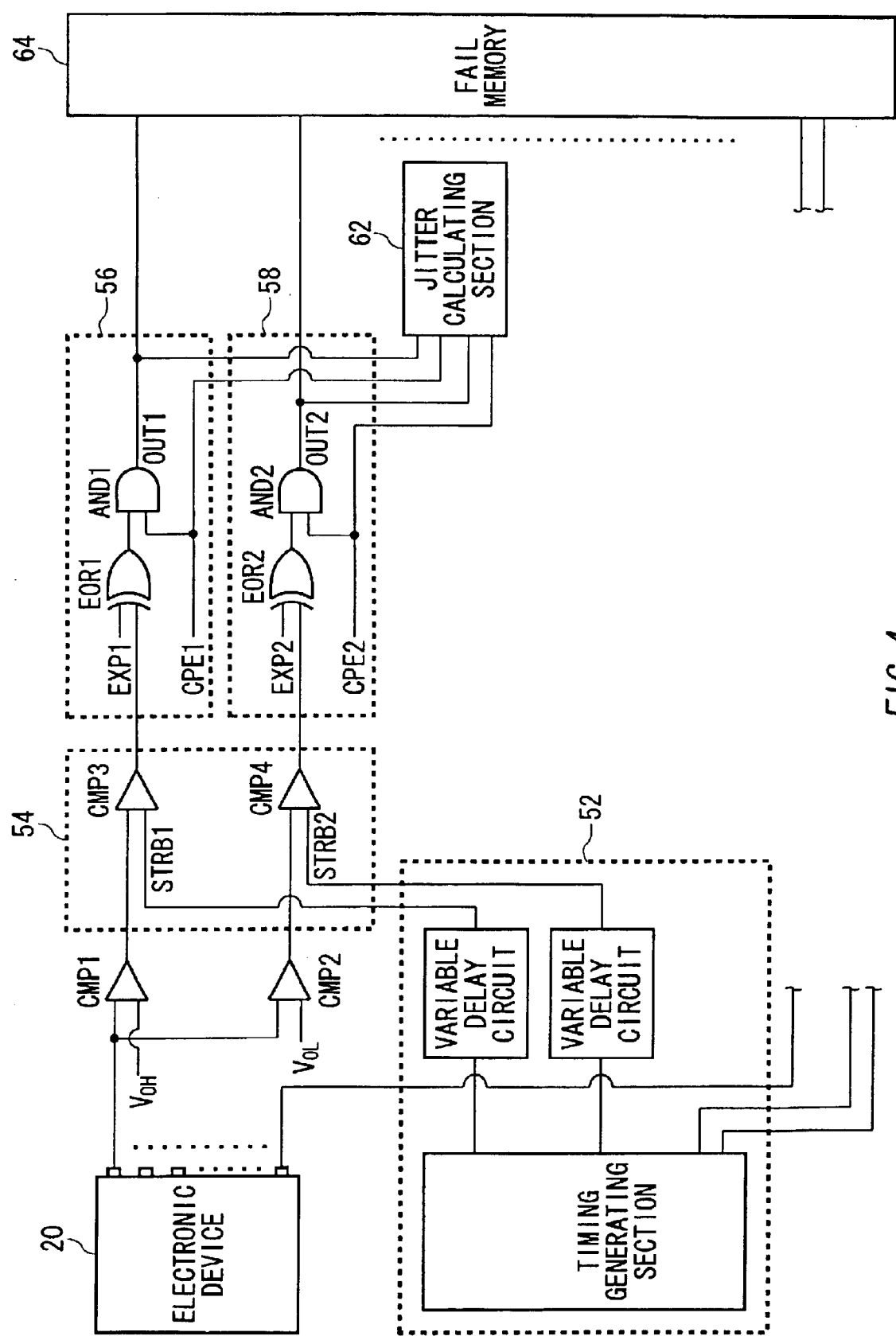
FIG. 4 is a block diagram exemplary showing a circuit configuration of a jitter quantity calculator 50.

FIG. 4 is a block diagram exemplary showing a circuit configuration of the jitter quantity calculator 50. In FIG. 4, the component which bears the same reference numeral as FIG. 2 has the same or similar operation and function as that of what has been explained in relation to FIG. 2 and FIG. 3. The output signal output from the electronic device 20 is input into the value calculating section 54 through level comparator circuits (CMP1, CMP2). Timing is input into the value calculating section 54 from the timing generator 52. The timing generator 52 includes a timing generating section and a variable delay circuit for generating desired timing and inputting it into the value calculating section 54.

The value calculating section 54 acquires the value of the output signal multiple times based on the input timing. The timing generator 52 generates different timings whenever the value calculating section 54 acquires the value of the output signal a predetermined number of times. The value calculating section 54 supplies the value of the acquired output signal to the first decision section 56 and the second decision section 58. The value acquired at the timing STRB1 is supplied to the first decision section 56, and the value acquired at the timing STRB2 is supplied to the second decision section 58. For example, the first decision section 56 includes EOR1 circuit for calculating exclusive OR, and AND1 circuit for calculating AND. The value acquired by the value calculating section 54 and EXP1 signal, which is a signal for controlling the EOR1, are input into the EOR1. The EOR1 decides whether the value acquired by the value calculating section 54 is greater than or equal to the first reference value based on the EXP1 signal. For example, in the EOR1, if it is greater than or equal to the first reference value, a pass signal (1) is output, and if it is less than the first reference value, a fail signal (0) is output. For example, when the first reference value is the above-explained VOH (logical value 1), the EXP1 is set to be zero. The decision result output from the EOR1 is input into the AND1. The decision result of the EOR1, and CPE1 signal are input into the AND1. The AND1 determines whether to send information on the decision result of the EOR1 to the jitter calculating section 62. If the CPE1 is zero, the decision result of the EOR1 is masked by the CPE1.

For example, the second decision section 58 includes EOR2 circuit for calculating exclusive OR and AND2 circuit for calculating AND. The EOR2 and the AND2 have similar functions to the EOR1 and the AND1 of the first decision section 56 respectively. The EOR2 decides whether the value acquired by CMP4 is greater than or equal to the second reference value. For example, when the second reference value is the above-explained VOL (logical value 0), the CPE2 is set to be 1. The AND2 determines whether to send the decision result of the EOR2 to the jitter calculating section 62.

A fail memory 64 stores the decision results of the first decision section 56 and the second decision section 58, and is used for the detailed analysis of the electronic device 20. The jitter calculating section 62 calculates the quantity of jitter of the output signal based on the decision results of the first decision section 56 and the second decision section 58. In order to calculate the quantity of jitter of the different output signals output from different output pins of the electronic device 20, the jitter calculator 50 includes: a plurality of the value calculating sections 54; the first decision sections 56; the second decision sections 58; and the jitter calculating sections 62, and the timing generator 52 supplies the timing to each of the plurality of value calculating sections 54 independently.

Figure 5:
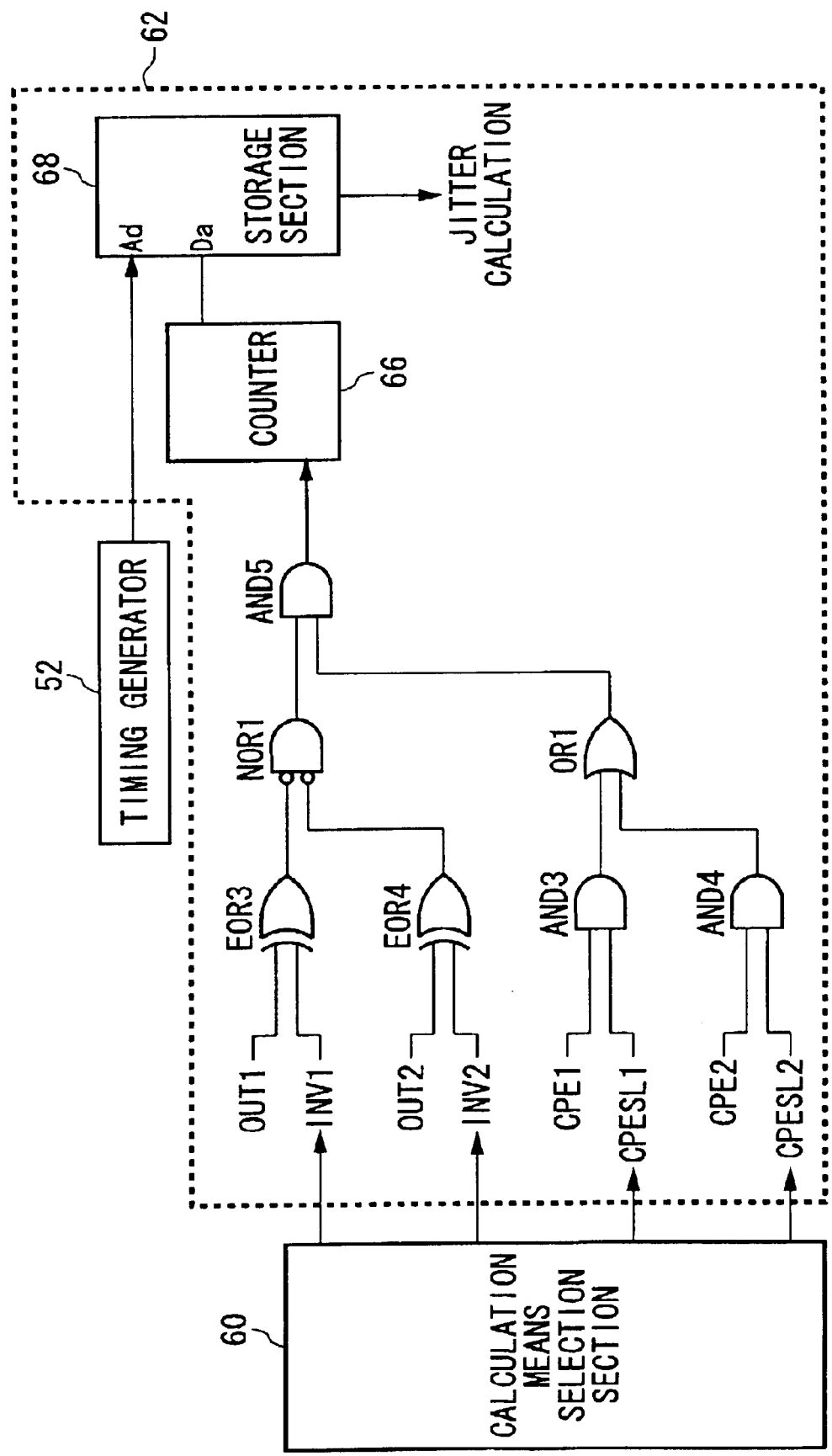
FIG. 5 is a block diagram exemplary showing a circuit configuration of the jitter calculating section 62.

FIG. 5 is a block diagram exemplary showing a circuit configuration of the jitter calculating section 62. The jitter calculating section 62 includes the plurality of calculation means explained in relation to FIG. 3. The calculation means selection section 60 selects either of the plurality of calculation means and causes it to calculate the quantity of jitter. The decision result (OUT1) output from the first decision section 56 is input into EOR3, and the decision result (OUT2) output from the second decision section 58 is input into EOR4. Signals INV1 and INV2 for switching the calculation means are input into the EOR3 and the EOR4 respectively. The calculation means selection section 60 sets up INV1, INV2, CPE1, and CPE2 based on the selected calculation means. The EOR3 and EOR4 input signals into NOR1 based on the criteria of the selected calculation means. For example, when the calculation means selection section 60 selects the fourth calculation means which is explained in relation to FIG. 3, each of CPE1, CPE2 and INV1 is set to be 1, and INV2 is set to be 0. In this case, 0 is output from each of the EOR3 and the EOR4 if it satisfies the criteria of the selected calculation means, and if it does not satisfy the criteria, 1 is output.

The NOR1 outputs a signal to AND5 based on the signal output from the EOR3 and the EOR4. For example, if both the signals from the EOR3 and the EOR4 are 0, i.e., if both of the criteria of the selected calculation means are satisfied, 1 is output to the AND5. The AND5 defines whether the signal input from the NOR1 is to be supplied to a counter 66. A signal is input into the AND5 from the OR1. The signal input from the OR1 is defined by CPE1, CPE2, CPESL1, and CPESL2, and the calculation means selection section 60 sets up these signals. The signal output from the OR1 synchronizes with the signal output from the NOR1.

The counter 66 counts the number how many times the input signal is a predetermined signal. For example, if the criteria of the calculation means are satisfied, the counter counts one digit. The storage section 68 stores the number of the counts how many times the counter 66 counts. Whenever the timing generator 52 generates the different timing, an address signal is input into the storage section 68, and whenever the timing generator 52 generates the different timing, the counter 66 stores a different address with the number of the counts how many times it counts a predetermined signal. The jitter calculating section 62 calculates the quantity of jitter of the output signal of the electronic device 20 based on the number of the decision for each of the different timings stored in the storage section 68.

It is obvious that the logical circuit elements explained in FIGS. 4 and 5 and CPE1, CPE2, INV1, INV2 and the like may be setup differently from the above-explained example. For example, although the CPE2 is set to be 1 in this example when the second reference value is the above-explained VOL (logical value 0), it is obvious that the same or similar function as/to that of the jitter calculator 50 explained in this example can be attained by arrangement of the logical circuit elements and the setup of INV1 and INV2 even if the CPE2 is set to be 0 in another example.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As described above, according to the present invention, the quantity of jitter of the output signal of the electronic device can be calculated accurately and rapidly. Moreover, it is possible to analyze the electronic device in detail by including a plurality of calculation means and by switching the calculation means.

What is claimed is:

1. A jitter quantity calculator for calculating quantity of jitter of an output signal output from an electronic device, comprising:
    a timing generator for generating timing;
    a value calculating section for calculating a value of the output signal multiple times based on the timing generated by said timing generator;
    a first decision section for deciding whether the value of the output signal, which is calculated by said value calculating section multiple times, is greater than or equal to a first reference value, and for outputting the decision result;
    a second decision section for deciding whether the value of the output signal, which is calculated by said value calculating section multiple times, is greater than or equal to a second reference value, and for outputting the decision result; and
    a jitter calculating section including first calculation means for calculating the quantity of jitter of the output signal based on the number of times the value of the decision result of the output signal is less than the first reference value in the first decision section and the value of the output signal is greater than or equal to the second reference value in the second decision section, wherein
    said timing generator generates different timing whenever said value calculating section calculates the value of the output signal a predetermined number of times, and
    said first calculation means calculates the quantity of jitter of the output signal based on the number of the decision for each of the different timings.

2. The jitter calculator as claimed in claim 1, wherein said timing generator generates two timings in a predetermined interval,
    said first decision section decides whether the value of the output signal, which is calculated multiple times by said value calculating section based on one of the two timings, is greater than or equal to the first reference value, and outputs the decision result,
    said second decision section decides whether the value of the output signal, which is calculated multiple times by said value calculating section based on the other timing of the two timings, is equal to or greater than the second reference value, and outputs the decision result, and
    said timing generator generates two different timings whenever said value calculating section calculates the value of the output signal a predetermined times.

3. The jitter quantity calculator as claimed in claim 2, wherein said jitter calculating section further comprises fourth calculation means for calculating the quantity of jitter of the output signal based on the number of times the value of the decision result of the output signal is greater than or equal to the first reference value in said first decision section and the value of the output signal is less than the second reference value in said second decision section, and said fourth calculation means calculates the quantity of jitter of the output signal based on the number of the decision for each of the two different timings.

4. The jitter quantity calculator as claimed in claim 3, wherein said jitter calculating section further comprises:
    fifth calculation means for calculating the quantity of jitter of the output signal based on the number of times the value of the decision result of the output signal is greater than or equal to the first reference value in said first decision section and the value of the output signal is greater than or equal to the second reference value in said second decision section; and
    sixth calculation means for calculating the quantity of jitter of the output signal based on the number of times the value of the decision result of the output signal is less than the first reference value in said first decision section and the value of the output signal is less than the second reference value in said second decision section, and
    said fifth calculation means and said sixth calculation means calculate the quantity of jitter of the output signal based on the number of the decision for each of the two different timings, and
    the jitter quantity calculator further comprises a calculation means selection section for selecting either said first calculation means, said fourth calculation means, said fifth calculation means or said sixth calculation means, and for causing it to calculate the quantity of jitter of the output signal.

5. The quantity-of-jitter calculator as claimed as claim 4, wherein said calculation means selection section supplies selection information to said jitter calculating section, the selection information indicating a either of said calculation means which is to be selected among said first calculation means, said fourth calculation means, said fifth calculation means or said sixth calculation means, said jitter calculating section receives the selection information and the decision result of said first decision section and said second decision section, said jitter calculating section decides whether each of said decision result satisfies criteria of said selected calculation means, and said jitter calculating section counts the number, how many times the decision result satisfies the criteria, as the number of the decision.

6. The quantity-of-jitter calculator as claimed in claim 5, wherein said calculation means selection section supplies a switching signal INV1 and a switching signal INV2, which indicate the criteria of the calculation means which is to be selected, to said quantity-of-jitter calculating section as the selection information, and said jitter calculating section comprises:
   a first criteria comparison section for receiving the switching signal INV1 and a decision result of said first decision section, and for deciding whether the decision result of said first decision section satisfies the criteria of the selected calculation means;
   a second criteria comparison section for receiving the switching signal INV2 and the decision result of said second decision section, and for deciding whether the decision result of said second decision section satisfies the criteria of the selected calculation means;
   a third criteria comparison section for deciding whether the decision result of both said first decision section and said second decision section satisfies the criteria of the selected calculation means based on the decision result of said first criteria comparison section and said second criteria comparison section; and
   a counter for counting the number how many time both of the criteria of the selected calculation means are satisfied in said third criteria comparison section as the number of the decision.

7. The quantity-of-jitter calculator as claimed in claim 6, wherein said first criteria comparison section is a first exclusive-OR circuit outputting exclusive OR of the decision result of said first decision section and the switching signal INV1, said second criteria comparison section is a second exclusive-OR circuit outputting exclusive OR of the decision result of said second decision section and the switching signal INV2, said third criteria comparison section is an AND circuit outputting AND of negation of the output of the first exclusive-OR circuit, and negation of the output of the second exclusive-OR circuit.

8. The quantity-of-jitter calculator as claimed in claim 7, wherein said first decision section comprises a first switching section for switching whether to supply the decision result of said first decision section to said jitter calculating section, said second decision section comprises a second switching section for switching whether to supply the decision result of said second decision section to said jitter calculating section, and said calculation means selection section supplies a control signal CPE for controlling said first switching section and said second switching section to said first switching section and said second switching section.

9. The quantity-of-jitter calculator as claimed in claim 8, wherein said jitter calculating section further comprises a third switching section for switching whether to supply the decision result of said third criteria comparison section to said counter based on the control signal CPE.

10. The jitter quantity calculator as claimed in claim 3, wherein said jitter calculating section further comprises fifth calculation means for calculating the quantity of jitter of the output signal based on the number of times the value of the decision result of the output signal is greater than or equal to the first reference value in said first decision section and the value of the output signal is greater than or equal to the second reference value in said second decision section, and said fifth calculation means calculates the quantity of jitter of the output signal based on the number of the decision for each of the two different timings.

11. The jitter quantity calculator as claimed in one of claim 10, wherein said jitter calculating section further comprises sixth calculation means for calculating the quantity of jitter of the output signal based on the number of times the value of the decision result of the output signal is less than the first reference value in said first decision section and the value of the output signal is less than the second reference value in said second decision section, and said sixth calculation means calculates the quantity of jitter of the output signal based on the number of the decision for each of the two different timings.

12. The jitter quantity calculator as claimed in claim 1, wherein said jitter calculating section further comprises second calculation means for calculating the quantity of jitter of the output signal based on the number of times the value of the decision result of the output signal is greater than or equal to the first reference value in the first decision section, and said second calculation means calculates the quantity of jitter of the output signal based on the number of the decision for each of the different timings.

13. The jitter quantity calculator as claimed in claim 12, wherein said jitter calculating section further comprises third calculation means for calculating the quantity of jitter of the output signal based on the number of times the value of the decision result of the output signal is less than the second reference value in the second decision section, and said third calculation means calculates the quantity of jitter of the output signal based on the number of the decision for each of the different timings.

14. The jitter quantity calculator as claimed in claim 12, wherein said jitter calculating section further comprises third calculation means for calculating the quantity of jitter of the output signal based on the number of the decision how many times the value of the decision result of the output signal is less than the second reference value in the second decision section, and said third calculation means calculates the quantity of jitter of the output signal based on the number of the decision for each of the different timings, and the jitter quantity calculator further comprises a calculation means selection section for selecting either said first calculation means, said second calculation means or said third calculation means to causes it to calculate the quantity of jitter of the output signal.

15. The jitter calculator as claimed in claim 1, wherein said jitter calculating section further comprises a storage section for storing the number of the decision for each of the different timings which are generated by said timing generator whenever said value calculating section calculates the value of the output signal a predetermined number of times.

16. A tester for deciding acceptability of an electronic device, comprising:
   a signal generator for generating a test signal for test and for inputting it into the electronic device;
   a jitter quantity calculator for calculating quantity of jitter of an output signal output from the electronic device based on the input test signal; and
   an acceptability decision section for deciding the acceptability of the electronic device based on the quantity of jitter calculated by said jitter quantity calculator, wherein
      said jitter quantity calculator comprises:
         a timing generator for generating timing;
         a value calculating section for calculating a value of the output signal multiple times based on the timing generated by said timing generator;
         a first decision section for deciding whether the value of the output signal, which is calculated by said value calculating section multiple times, is greater than or equal to a first reference value, and for outputting the decision result;
         a second decision section for deciding whether the value of the output signal, which is calculated by said value calculating section multiple times, is less than a second reference value, and for outputting the decision result; and
         a jitter calculating section including first calculation means for calculating the quantity of jitter of the output signal based on the number of times the value of the decision result of the output signal is less than the first reference value in the first decision section and the value of the output signal is greater than or equal to the second reference value in the second decision section, and
      said timing generator generates different timing whenever said value calculating section calculates the value of the output signal a predetermined number of times, and
   said first calculation means calculates the quantity of jitter of the output signal based on the number of the decision for each of the different timings.

* * * * *